(12) United States Patent
Ohta et al.

(10) Patent No.: US 7,800,096 B2
(45) Date of Patent: Sep. 21, 2010

(54) LIGHT EMITTING SEMICONDUCTOR

(75) Inventors: Yutaka Ohta, Tokyo (JP); Yoshikazu Oshika, Tokyo (JP)

(73) Assignee: Dowa Electronics Materials Co., Ltd., Tokyo (JP)

( * ) Notice: Subject to any disclaimer, the term of this patent is extended or adjusted under 35 U.S.C. 154(b) by 0 days.

(21) Appl. No.: 12/398,720

(22) Filed: Mar. 5, 2009

(65) Prior Publication Data

US 2009/0250684 A1 Oct. 8, 2009

(30) Foreign Application Priority Data

Apr. 2, 2008 (JP) .............................. 2008-096242

(51) Int. Cl.
*H01L 29/06* (2006.01)
(52) U.S. Cl. .......................................... 257/13; 257/79
(58) Field of Classification Search .................. 257/13, 257/79
See application file for complete search history.

(56) References Cited

FOREIGN PATENT DOCUMENTS

| JP | 11-150296 | 6/1999 |
|---|---|---|
| JP | 2003-086841 | 3/2003 |
| JP | 2003-243703 | 8/2003 |
| JP | 2009-010304 | 1/2009 |
| JP | 2009-164272 | 7/2009 |

*Primary Examiner*—Long Pham
(74) *Attorney, Agent, or Firm*—Pillsbury Winthrop Shaw Pittman LLP

(57) ABSTRACT

A semiconductor element is disclosed having a layered body of a first conductivity type, a light emitting layer, a layered body of a second conductivity type, a constriction layer having a constriction hole, and a first electrode having a lighting hole, a second electrode positioned such that charge traveling between the first and second electrodes passes through the light emitting layer. The constriction hole area is larger than the lighting hole area, and the lighting hole and the constriction hole expose a part of the layered body of the second conductivity type. A mirror is positioned such that the mirror receives light emitted from the light emitting layer that passes through the layered body of the first conductivity type, and the mirror is constructed to have a high reflection ratio for light having peak wavelengths between 200 nm to 350 nm.

19 Claims, 4 Drawing Sheets

LIGHT EMITTING SEMICONDUCTOR

FIELD OF THE INVENTION

This invention relates to the field of a light emitting semiconductor element and a method for producing the same.

BACKGROUND OF THE INVENTION

Light emitting semiconductor elements are well known and exist in many varieties. Examples of light emitting semiconductor elements are disclosed by Unexamined Japanese Publication Nos. 2003-243703, 2003-86841, and H11-150296, all three of which are hereby incorporated by reference in their entirety. Publication Nos. 2003-243703 and 2003-86841 disclose a current blocking layer (also referred to as a current constriction layer) that is partially inserted into a plurality of semiconductor layers, thereby forming a buried current blocking layer. Publication No. H11-150296 discloses a current blocking layer that is partially fabricated on semiconductor layers and an electrode that is fabricated to cover the entire hole area of the current blocking layer and a part of the current blocking layer.

SUMMARY OF THE INVENTION

An aspect of the present invention is to provide a light emitting element having a high light emitting efficiency, and a method for manufacturing the same with a lower cost. In order to achieve that objective, a semiconductor element according to a preferred embodiment of the present invention includes a layered body of a first conductivity type, a light emitting layer, a layered body of a second conductivity type, a constriction layer having a constriction hole, and a first electrode having a lighting hole. An area of the constriction hole is larger than an area of the lighting hole. In addition, the lighting hole and the constriction hole expose a part of the layered body of the second conductivity type. The first electrode and the layered body of the second conductivity type are operatively coupled with one another. A second electrode is positioned such that charge traveling between the first and second electrodes passes through the light emitting layer. A mirror is positioned such that it receives light emitted from the light emitting layer that passes through the layered body of the first conductivity type. The mirror is constructed and arranged to have a high reflection ratio for light having peak wavelengths between 200 nm to 350 nm.

A method for producing a semiconductor element according to a preferred embodiment of the present invention includes epitaxially growing a layered structure. The layered structure includes a constriction layer, a layered body of a second conductivity type, a light emitting layer, and a layered body of a first conductivity type. A mirror is formed on a substrate positioned such that the mirror receives light emitted from the light emitting layer that passes through the layered body of the first conductivity type. The mirror substrate is constructed and arranged to have a high reflection ratio for light having peak wavelengths between 200 nm to 350 nm. A constriction hole is formed in the constriction layer that at least partially covers the constriction layer with a first electrode. In addition, a lighting hole is formed in the first electrode to expose a part of the layered body of the second conductivity type, wherein the lighting hole has a smaller area than the constriction hole. A second electrode is formed in a position such that charge traveling between the first and second electrodes passes through the light emitting layer.

Other objects, features and aspects of the invention will become apparent from the following detailed description, the accompanying drawings, and the appended claims.

BRIEF DESCRIPTION OF THE DRAWINGS

The novel features that are considered characteristic of the invention are set forth with particularity in the appended claims. The invention itself; however, both as to its structure and operation together with the additional objects and advantages thereof are best understood through the following description of the preferred embodiment of the present invention when read in conjunction with the accompanying drawings, wherein:

DETAILED DESCRIPTION OF THE PREFERRED EMBODIMENTS

While the invention has been shown and described with reference to a particular embodiment thereof, it will be understood to those skilled in the art, that various changes in form and details may be made therein without departing from the spirit and scope of the invention.

Figure 1:
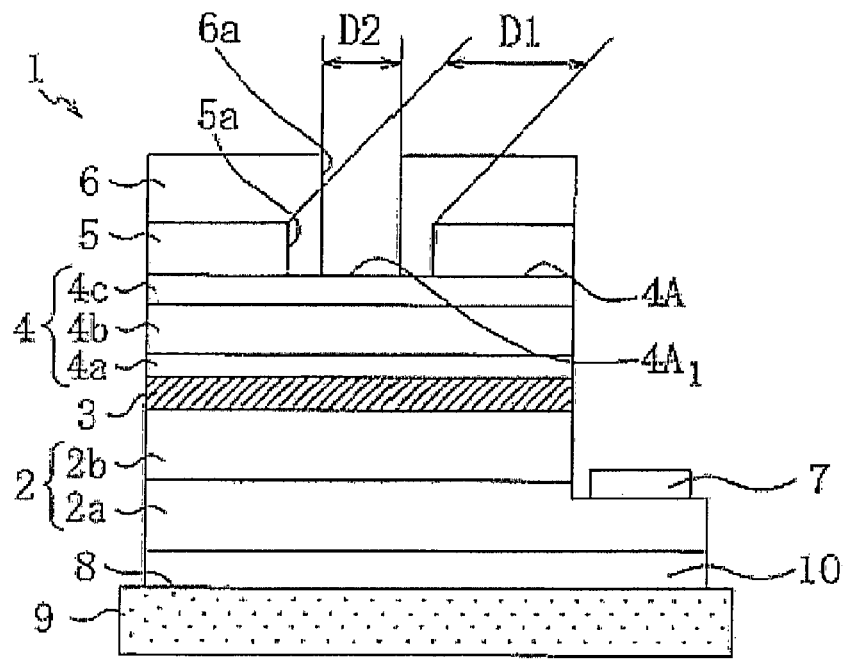
FIG. 1 illustrates a schematic cross-sectional diagram showing the construction of a semiconductor light emitting element according to a preferred embodiment the present invention.

In the following description, exemplary embodiments of the present invention are described in reference to the drawings. Referring to the figures by characters of reference, FIG. 1 shows a schematic cross-sectional diagram of a semiconductor light emitting element according to a preferred embodiment of the present invention.

Semiconductor light emitting element 1 includes a layered body of a first conductivity type 2, a light emitting layer 3, a layered body of a second conductivity type 4, a constriction layer 5, a first electrode 6 having a lighting hole 6a, and a second electrode 7, which is positioned such that charge traveling between the first and second electrodes 6 and 7 passes through the light emitting layer 3. The constriction layer 5 has a constriction hole 5a that exposes the layered body of a second conductivity type 4 and that also constricts electric current. An area of the constriction hole 5a (also referred to as a second hole) is larger than an area of the lighting hole 6a (also referred to as a first hole). A part of first electrode 6 and the layered body of the second conductivity type 4 are operatively coupled with one another. The lighting hole 6a and the constriction hole 5a together expose a part of the layered body of the second conductivity type 4. A mirror 8 is positioned such that it receives light emitted from the light emitting layer that passes through the layered body of the first conductivity type. The mirror is constructed and arranged to have a high reflection ratio for light having peak wavelengths between 200 nm to 350 nm. This embodiment's structure provides for improved light emitting efficiency.

In an exemplary embodiment, lighting hole 6a and constriction hole 5a have a symmetric shape such as circle, rectangle, or other symmetric figure. In this one exemplary embodiment of the present invention, the area of the constriction hole 5a and the lighting hole 6a are explained by a constriction hole's 5a diameter D1 and a lighting hole's 6a diameter D2. A width of the hole is described in the cross-sectional diagram by a hatching in the figure merely for the convenience of explanation.

The layered body of the first conductivity type 2 is a p-type or an n-type layered body with a material selected from the group consisting of GaN, AlGaN, InGaN, and AlInGaN, which is either p-doped or n-doped. The light emitting layer 3 is formed of a material selected from the group consisting of GaN, AlGaN, InGaN, and AlInGaN.

The layered body of the second conductivity type 4 is an n-type or a p-type layered body, which has a conductivity type that is opposite to the conductivity type of the first conductivity type 2, and is formed from a material selected from the group consisting of GaN, AlGaN, InGaN, and AlInGaN.

The constriction layer 5 is formed of a material selected from the group consisting of p-type or n-type GaN, AlGaN, InGaN, AlInGaN, and is also formed of AlN, or SiO2, which are insulating materials, that is doped having an opposite conductivity type from that of the second conductivity type 4.

With reference again to FIG. 1, the following description illustrates one case in which the first conductivity type 2 is n-type and the second conductivity type 4 is p-type. The n-type layered body 2, in one embodiment, comprises an n-type contact layer 2a, and an n-type cladding layer 2b that is provided on the n-type contact layer 2a. The p-type layered body 4, in one embodiment, comprises a p-type electronic blocking layer 4a, a p-type cladding layer 4b which is provided on the p-type electronic blocking layer 4a, and a p-type contact layer 4c which is provided on the p-type cladding layer 4b. The light emitting layer 3, in one embodiment, comprises a multiple quantum well structure layer.

In one embodiment, the thickness of the n-type contact layer 2a and the n-type cladding layer 2b is between 1 to 5 micrometers and between 200 to 1000 nanometers, respectively. The thickness of the p-type electronic blocking layer 4a, the p-type cladding layer 4b, and the p-type contact layer 4c is between 5 to 50 nanometers, between 200 to 500 micrometers, and between 10 to 50 nanometers, respectively. The thickness of the light emitting layer 3 is, in one embodiment, between 20 to 150 nanometers. The thickness of the constriction layer 5 is, in one embodiment, between 0.8 to 1.5 micrometers. These ranges of thicknesses are useful for a light emitting element 1 to get good performance and to avoid absorption of light, and to avoid increasing crystal strain and forward current voltage. The flow of electric current between the layered body of second conductivity type 4 and the first electrode 6 will be prevented or substantially inhibited if the constriction hole's 5a diameter D1 and the lighting hole's 6a diameter D2 are the same (in other words, if the area and position of each hole 5a and 6a are the same). Thus, in one embodiment, the constriction hole's 5a diameter D1 is larger than the lighting hole's 6a diameter D2, and the center of the constriction hole 5a has a similar or almost the same horizontal position as the center of the lighting hole 6a.

In this embodiment, a smaller constriction hole's 5a diameter D1 causes a higher forward current voltage Vf. In addition, a smaller ratio of the lighting hole's 6a diameter D2 to the constriction hole's 5a diameter D1 (a larger ratio of the constriction hole's 5a diameter D1 to the lighting hole's 6a diameter D2) causes a larger electric connecting area of the first electrode 6 and a smaller forward current voltage (Vf). This smaller ratio also causes a smaller total light emitting power (Po) because of the smaller lighting hole's 6a diameter D2. Therefore, in one embodiment, a ratio of the constriction hole's 5a diameter D1 to the lighting hole's 6a diameter D2 is selected to satisfy a balance between high light emitting power and low forward current voltage. In a preferred embodiment, the ratio D1/D2 is preferably between 1.5 to 2.0. In FIG. 1, the first electrode 6 is covering the entire constriction layer 5 to get light emission almost solely from the lighting hole 6a. However, this feature is merely exemplary and can be changed so that only a portion of the constriction layer 5 is covered.

Figure 2:
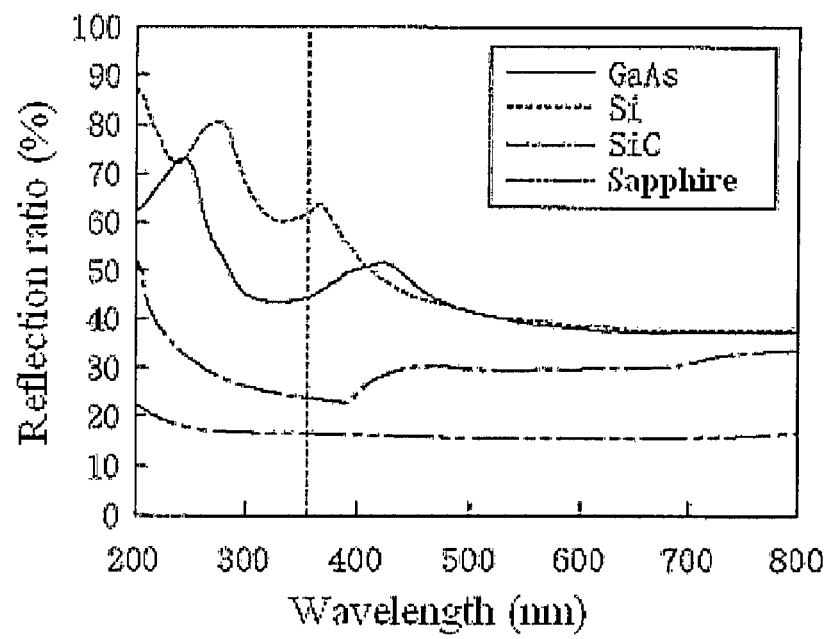
FIG. 2 illustrates a graph showing the relationship between an incidence light wavelength and a reflection ratio of various materials.
Figure 3:
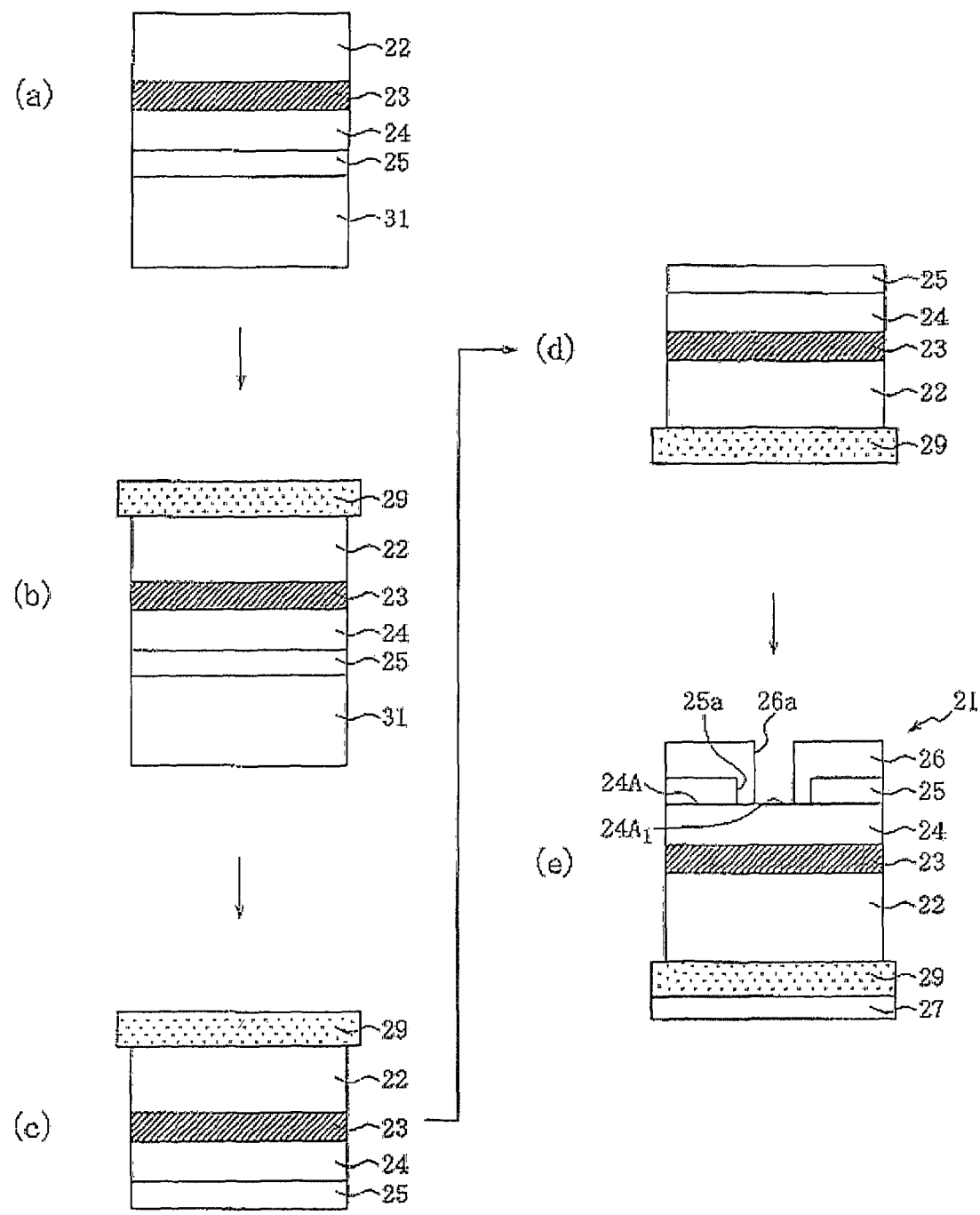
FIG. 3 illustrates a schematic cross-sectional diagram showing the construction of a semiconductor light emitting element according to a first embodiment of the present invention.

In one embodiment, the mirror substrate 8 has a high reflection ratio for emitted light having peak wavelengths between 200 nm to 350 nm, and the reflection ratio is greater than or equal to 60%, wherein it is desirable to have a sufficient light-emit efficiency gained from the upper surface. FIG. 2 shows an example of the relationship between the reflection ratio (%) and light wavelength (nm) for Si, GaAs, SiC, and sapphire. The reflection ratio of FIG. 2 is measured by an ultraviolet and viewable light spectrum analyzer that measures the reflection of light for specific wavelengths with an incidence angle of 5 degrees and calculates a relative value, wherein an aluminum reflection mirror has 100% reflectance.

As shown from FIG. 2, the reflection ratio of Si is no less than 60% and GaAs is no less than 45% for light having peek wavelengths between 200 nm to 350 nm. The reflection ratio of Si is no less than 70% and GaAs is no less than 60% for light having peek wavelengths between 200 nm to 265 nm. This feature means that Si and GaAs are good materials for the substrate of the mirror 8, and Si is the more desirable of the two materials. The layered body of a first conductivity type 2 may set on a mirror substrate 9 formed from such material, and the mirror 8 can be formed as the upper surface of the mirror substrate 9. A buffer layer 10 formed of an AlN material can be inserted between the mirror substrate 9 and the layered body of the first conductivity type 2. The buffer layer 10 can reduce dislocation caused by lattice mismatching and can reduce crystal dislocation density of layered crystal. Although not shown in the figures, a separate layer can be formed adjacent to the buffer layer 10 for a lift-off process. As described later in the specification, the buffer layer 10 can be used as a current constriction layer 5 when the buffer layer 10 is formed from an insulator like an AlN material.

The following examples describe an illustrative method of growing the buffer layer 10 and a layered element on a substrate such as sapphire, and transporting the element on a substrate 9 made of Si material by using a bonding and lift-off process. However, another method to grow the buffer layer 10 and the layered element directly on a mirror substrate (such as Si material) may also be applied in order to reduce the number of manufacturing processes.

The second electrode 7 can be applied to a side of the substrate 9 that is positioned on a side of the light emitting layer 3 that is opposite from the layered body of the second conductivity type 4. In this example, substrate 9 is formed of Si. The second electrode 7 brings equal current flow in the element and a reduction of joule heat, and also centralizes the emitting point and improves the light emitting efficiency. As shown in FIG. 1, the second electrode 7 can also be applied on the top of the exposed part of the layered body of the first conductivity type 2.

In the following description, an exemplary method for producing the semiconductor elements that form the present invention is described. As shown in FIGS. 3(a) to (e), a first exemplary method is illustrated for producing a semiconductor element 21. This method includes epitaxially growing the following layers on a growth substrate 31 by MOCVD: a constriction layer 25, a layered body of a second conductivity type 24, a light emitting layer 23, and a layered body of a first conductivity type 22. A mirror substrate 29 is then formed adjacent to the layered body of first conductivity type 22. The mirror substrate 29 is constructed and arranged to have a high reflection ratio for light having peak wavelengths between 200 nm to 350 nm. The growth substrate 31 is then removed, the element is repositioned, and constriction hole 25(a) is formed in the constriction layer 25. The constriction layer 25 is then covered with a first electrode 26. A lighting hole 26(a) is formed in the first electrode 26 to expose a part 24(A1) of the top area 24(A) of the layered body of the second conductivity type 24. The lighting hole 26(a) has a smaller area than the constriction hole 25(a). A second electrode 27 is formed on the bottom of the mirror substrate 29. In a preferred embodiment, the constriction layer 25 is formed of an AlN material.

In the following description, another exemplary method for producing semiconductor elements of the present invention is described. Specifically, as shown in FIGS. 4(a) to (f), a second exemplary method is illustrated for producing a semiconductor element 41. This method includes epitaxially growing the following layers on a growth substrate 51 by MOCVD: a layered body of a first conductivity type 42, a light emitting layer 43, a layered body of a second conductivity type 44, and a constriction layer 45. A temporary substrate 52 is formed adjacent to the constriction layer 45. The growth substrate 51 is then removed. A mirror substrate 49 is then formed adjacent to the layered body of the first conductivity type 42. The mirror substrate 49 is constructed and arranged to have a high reflection ratio for light having peak wavelengths between 200 nm to 350 nm. The temporary substrate 52 is then removed. A constriction hole 45(a) is then formed at the constriction layer 45. The constriction layer 45 is then covered with a first electrode 46. A lighting hole 46(a) is then formed in the first electrode 46 to expose a part 44(A1) of the top area 44(A) of the layered body of the second conductivity type 44. The lighting hole 46(a) has a smaller area than the constriction hole 45(a). A second electrode 47 is then formed on the bottom of the mirror substrate 49. In one embodiment, a buffer layer 50 is formed from AlN material is epitaxially grown between the growth substrate 51 and the layered body of the first conductivity type 42, and is removed or separated together at the process of removing the growth substrate 51. Moreover, it is desirable for the temporary substrate 52 to be formed of a material that is easily coupled and removed and is also stable at the time of being combined to the mirror substrate 49. It is also desirable that the material forming the temporary substrate 52 be less effective at being coupled to another part of semiconductor element at the time of removing the temporary substrate 52. For example, a desirable material for the temporary substrate 52 includes materials used for a semiconductor substrate like as Si, GaAs, metal substrate, and resin.

In the following description, another exemplary method for producing a semiconductor element according to an embodiment of the present invention is presented. Specifically, as shown in FIG. 5(a) to (f), a third exemplary method is illustrated for producing a semiconductor element 61. This method includes epitaxially growing the following layers on a growth substrate 71 by MOCVD: a layered body of a first conductivity type 62, a light emitting layer 63, a layered body of a second conductivity type 64, and a constriction layer 65.

A temporary substrate 72 is formed adjacent to the constriction layer 65. The growth substrate 71 is then removed. A mirror substrate 69 is formed adjacent to the layered body of first conductivity type 62. The mirror substrate 69 is constructed and arranged to have a high reflection ratio for light having peak wavelengths between 200 nm to 350 nm. The temporary substrate 72 is then removed. A top portion of the layered body of the first conductivity type 62 is then exposed. A constriction hole 65(a) is then formed in the constriction layer. The constriction layer 65 is then covered with a first electrode 66. A lighting hole 66(a) is then formed in the first electrode 66 to expose a part 64(A1) of the top area 64(A) of the layered body of the second conductivity type 64. The lighting hole 66(a) has a smaller area than the constriction hole 65(a). A second electrode 67 is then formed on the exposed area of the layered body of first conductivity type 62. In one embodiment, a buffer layer 70 is formed of an AlN material that is epitaxially grown between the growth substrate 71 and the layered body of a first conductivity type 62. The semiconductor elements and manufacturing methods disclosed above are merely exemplary embodiments of the present invention and it is contemplated that other semiconductor elements and manufacturing methods may be used for the present invention and that the present invention is not limited to the above disclosed exemplary elements and manufacturing methods.

Three exemplary embodiments of a Light Emitting Diode (LED) are discussed below. The first exemplary embodiment discloses an LED having the configuration shown in FIG. 3, which is fabricated by first a manufacturing method. In this first exemplary embodiment, the first conductivity type layer 2 is p-type, and a second conductivity type layer 4 is n-type.

First, as shown in FIG. 3(a), a layered structure is consecutively grown on a top of sapphire substrate 31 by MOCVD. These layers include an AlN buffer layer 25 (1000 nm thick), and which also functions as a constriction layer, a layered body of n-type 24 (2500 nm thick), a light emitting layer 23 (90 nm thick), and a layered body of p-type 22 (240 nm thick). The layered body of n-type layer 24 is layered by a Si-doped Al0.5Ga0.5N contacting layer (2000 nm thick) and next a Si-doped Al0.48Ga0.52N cladding layer (500 nm thick).

Light emitting layer 23 has a InAlGaN multiple quantum well structure made of In0.01Al0.42Ga0.57N barrier layers and In0.01Al0.34Ga0.65N quantum well layers. The p-type layered body is layered in order by a Mg-doped Al0.7Ga0.3N electronic blocking layer (20 nm), Mg-doped Al0.5Ga0.5N cladding layer (200 nm) and Mg-doped GaN contacting layer (20 nm).

Next, as shown in FIG. 3(b), the layered body of p-type 22 is coupled with Si substrate 29 (300 μm thick), which has a high reflection ratio for light having peak wavelengths between 200 nm to 350 nm. As shown in FIG. 3(c), the sapphire substrate 31 is removed by lift-off process. Next, as shown in FIG. 3(d), the element is repositioned. As shown in FIG. 3(e), a constriction hole 25a is formed in the shape of a circle shape in the AlN buffer layer 25 by a method of wet etching, thereby forming a constriction layer. The electric blocking layer 25 is covered first by electrode 26 (200 nm thick). Lighting hole 26a, which has a circular shape, is formed to expose a part of surface 24A1 at a surface area 24A of a layered body of n-type conductivity. The lighting hole 26a has a diameter D2 (100 μm thick) that is smaller than the constriction hole's diameter D1 (150 μm thick). In addition, a second electrode 27 (200 μm thick) is formed on the bottom of Si substrate 29. The shape and size of the LED according to an exemplary embodiment of the present invention is a square that measures 300 µm by 300 µm. The emitted light from this LED has a peak wavelength of 300 nm.

Figure 4:
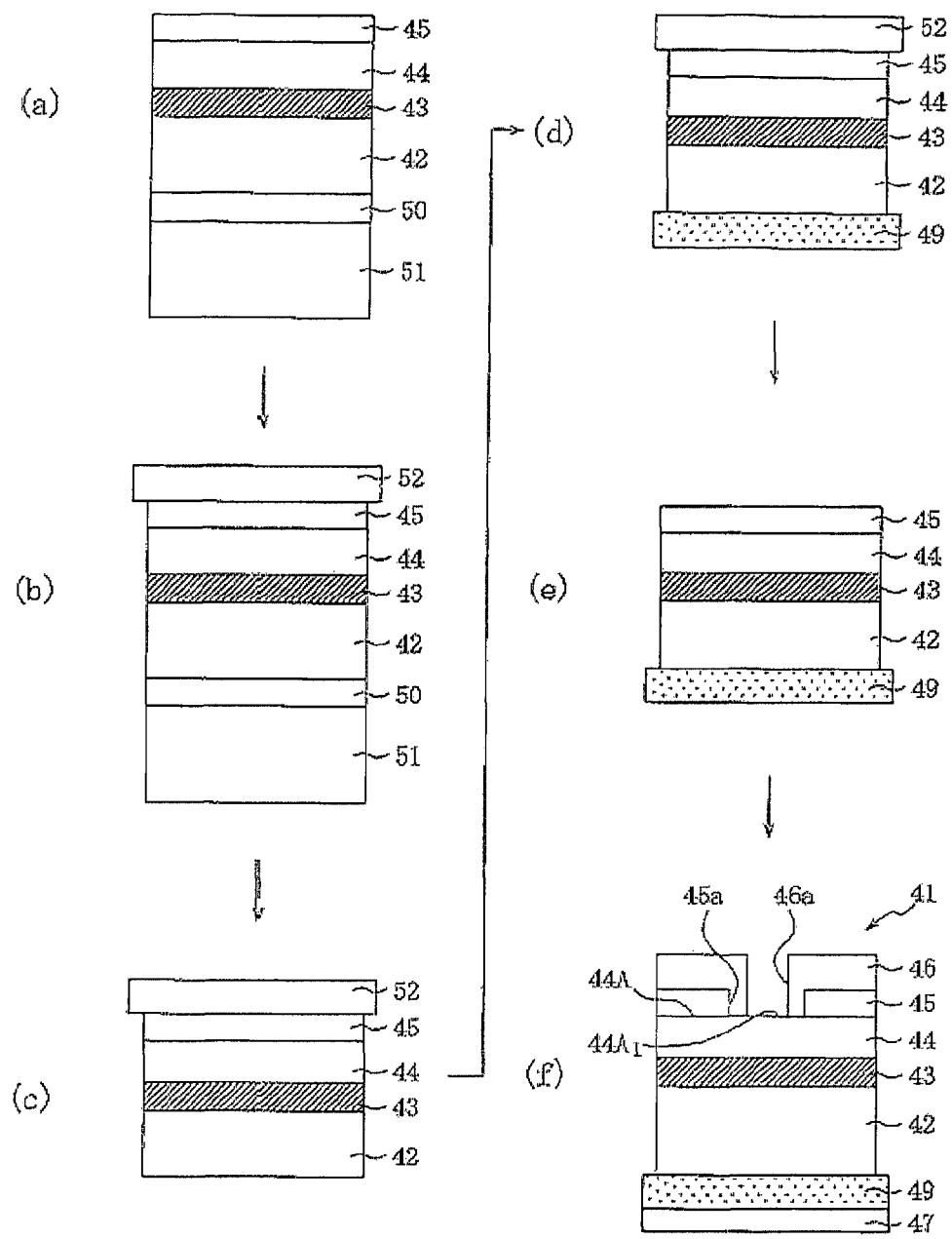
FIG. 4 illustrates a schematic cross-sectional diagram showing the construction of a semiconductor light emitting element according to a second embodiment of the present invention.

The second exemplary embodiment of the present invention is an LED having the configuration shown in FIG. 4, which is fabricated by second manufacturing method. In this second exemplary embodiment, the first conductivity type layer 2 is n-type, and the second conductivity type layer 4 is p-type. First, as shown in FIG. 4(a), a layered structure is consecutively grown on a top of sapphire substrate 51 by MOCVD. This layered structure includes an AlN buffer layer 50 (1000 nm thick), a layered body of n-type 42 (2500 nm thick), a light emitting layer 43 (90 nm thick), a layered body of p-type 44 (240 nm thick), and n-type constriction layer 45 (1000 nm thick). The layered body of n-type 42 is layered by a Si-doped Al0.5Ga0.5N contacting layer (2000 nm thick) and a Si-doped Al0.48Ga0.52N cladding layer (500 nm thick).

The light emitting layer 43 has a InAlGaN multiple quantum well structure made of In0.01Al0.42Ga0.57N barrier layers and In0.01Al0.34Ga0.65N quantum well layers. The layered body of p-type 44 is layered with a Mg-doped Al0.7Ga0.3N electronic blocking layer (20 nm thick), an Mg-doped Al0.5Ga0.5N cladding layer (200 nm thick) and a Mg-doped GaN contacting layer (20 nm thick). Next, as shown in FIG. 4(b), a proper temporary substrate 52 is formed adjacent to the n-type constriction layer 45, and as shown in FIG. 3(c), the sapphire substrate 51 and AlN buffer layer 50 are removed by lift-off process.

Next, as shown in FIGS. 4(d) and 4(e), Si substrate 49 (300 µm thick), which has a high reflection ratio for light having peak wavelengths between 200 nm to 350 nm, is coupled with the exposed face of the layered body of n-type after the lift-off process. Then, temporary substrate 52 is removed. Next, as shown in FIG. 4(f), a constriction hole 45a of circular shape is formed in the n-type constriction layer 45 by a method of wet etching. The constriction layer 45 is then covered by first electrode 46 (200 nm thick), and a lighting hole 46a of circular shape is formed to expose a part of surface 44A1 at a surface area 44A of a layered body of p-type. The lighting hole 46a has a diameter D2 (100 µm), which is smaller than the constriction hole's diameter D1 (150 µm). In addition, a second electrode 47 (200 µm thick) is formed on the bottom of Si substrate 49. The shape and size of LED is that of a square measuring 300 µm by 300 µm. The emitted light from this LED has a peak wavelength of 300 nm.

Figure 5:
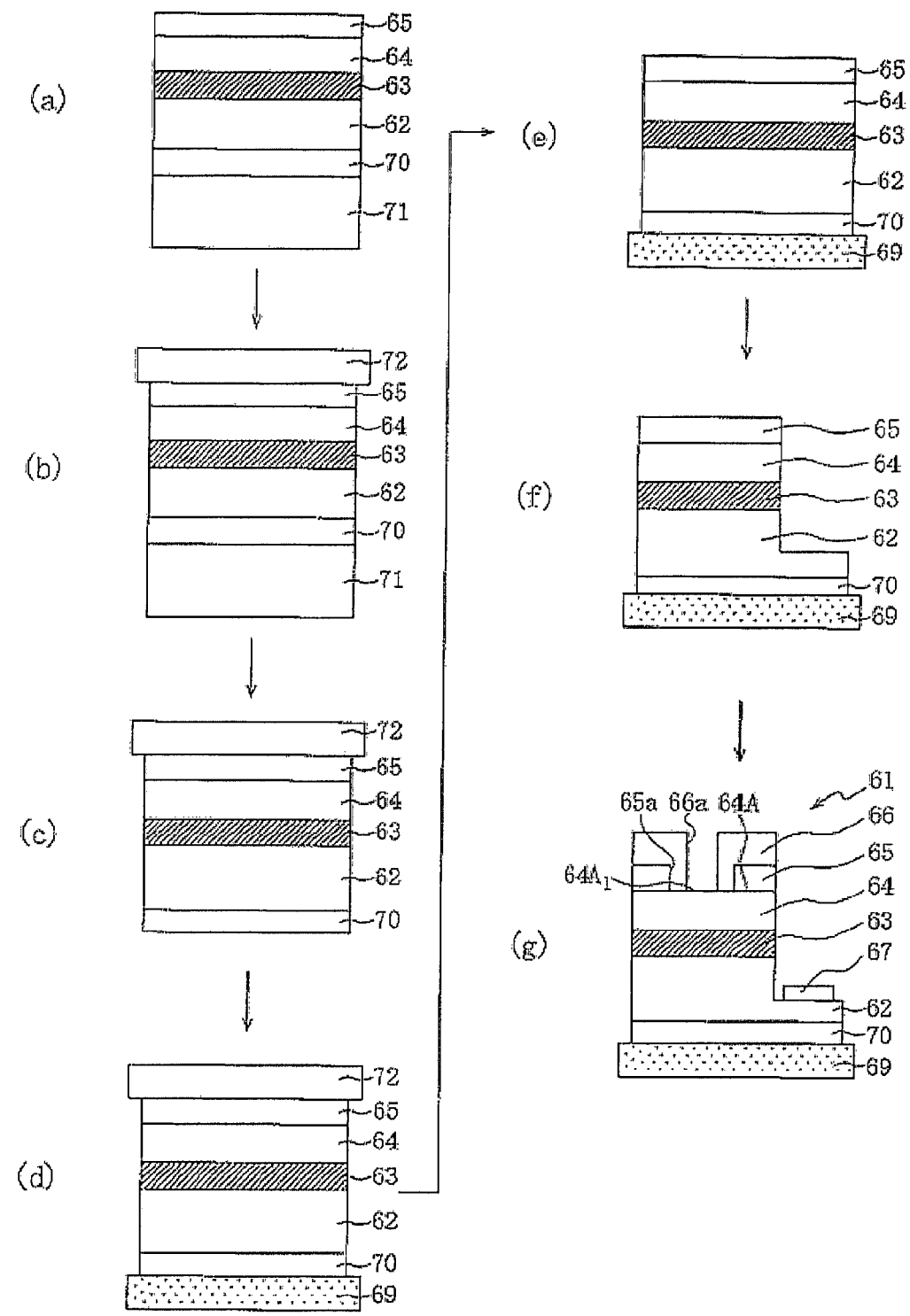
FIG. 5 illustrates a schematic cross-sectional diagram showing the construction of a semiconductor light emitting element according to a third embodiment of the present invention.

The third exemplary embodiment of the present invention is an LED having the configuration shown in FIG. 5 that is fabricated by a third manufacturing method. In this third exemplary embodiment, the first conductivity type layer 2 is n-type, and the second conductivity type layer 4 is p-type. First, as shown in FIG. 5(a), a layered structure is consecutively grown on a top of sapphire substrate 71 by MOCVD. The layers forming this layered structure include an AlN buffer layer 70 (approximately 1000 nm thick), a layered body of n-type 62 (2500 nm thick), a light emitting layer 63 (90 nm thick), a layered body of p-type 64 (240 nm thick), and n-type Al0.7Ga0.3N constriction layer 65 (1000 nm thick). The layered body of n-type 62 is layered by a Si-doped Al0.5Ga0.5N contacting layer (2000 nm thick) and an Si-doped Al0.48Ga0.52N cladding layer (500 nm thick). The light emitting layer 63 has an InAlGaN multiple quantum well structure made of In0.01Al0.42Ga0.57N barrier layers and In0.01Al0.34Ga0.65N quantum well layers.

The layered body of p-type 64 is layered with a Mg-doped Al0.7Ga0.3N electronic blocking layer (20 nm thick), a Mg-doped Al0.5Ga0.5N cladding layer (200 nm thick) and a Mg-doped GaN contacting layer (20 nm thick). Next, as shown in FIG. 5(b), a proper temporary substrate 72 is formed adjacent to the n-type constriction layer 65, and as shown in FIG. 3(c), the sapphire substrate 71 is removed by lift-off process. Next, as shown in FIGS. 5(d) and 5(e), Si substrate 69 (300 µm thick) which has a high reflection ratio for light having peak wavelengths between 200 nm to 350 nm, is formed adjacent to the exposed face of AlN buffer layer 70 after the lift-off process. Then, the proper temporary substrate 72 is removed.

Next, as shown in FIG. 5(f), a part of the n-type layered body 62 is exposed by a method of dry etching. Then, as shown in FIG. 5(g), a constriction hole 65a of circular shape is formed at the n-type constriction layer 65 by a method of wet etching. The constriction layer 65 is then covered by first electrode 66 (200 nm). A lighting hole 66a of circular shape is formed to expose a part of surface 64A1 at a surface area 64A of a p-type layered body. The lighting hole's 66a diameter D2 (100 µm) is smaller than the constriction hole's 65A diameter D1 (150 µm). In addition, a second electrode 67 (200 µm) is formed on the exposed area of the n-type layered body 62. The shape and size of LED is that of a square of dimensions 300 µm by 300 µm. The emitted light has a peak wavelength of 300 nm.

Table 1 shows tests results for light emitting power {Po (µW)} of the first, second and third embodiments described above. Direct current 20 mA is applied to the LED in this test.

TABLE 1

| Test results for Embodiments 1-3 | |
|---|---|
| Example | $P_o$ (µW) |
| 1 | 557.91 |
| 2 | 417.40 |
| 3 | 252.09 |

Table 2 shown below illustrates the light emitting power {Po (µW)} and forward current Voltage (Vf (V)) of four samples having the configuration of the third embodiment in which the constriction hole's diameter (D1) and the lighting hole's diameter (D2) is varied. A direct current of 20 mA was applied to the LED's in this test.

TABLE 2

| Light emitting power and forward current voltage of LEDs according to the third embodiment | | | | | |
|---|---|---|---|---|---|
| sample No | constriction hole's diameter D1 (µm) | lighting hole's diameter D2 (µm) | ratio D1/D2 | light emitting Power $P_o$ (µW) | forward current voltage $V_f$ (V) |
| 1 | 150 | 100 | 1.5 | 252.09 | 10.6 |
| 2 | 150 | 50 | 3.0 | 210.77 | 9.6 |
| 3 | 100 | 50 | 2.0 | 227.30 | 10.1 |
| 4 | 100 | 80 | 1.25 | 194.24 | 11.5 |

As shown in Table 2 above, so as to satisfy the balance between a higher light emitting power and a lower forward current voltage, a optimal ratio for D1/D2 is from 1.5 to 2.0.

While the invention has been shown and described with reference to a particular embodiment thereof, it will be understood to those skilled in the art, that various changes in form and details may be made therein without departing from the spirit and scope of the invention.

The invention claimed is:

1. A semiconductor element, comprising:
   a layered body of a first conductivity type, a light emitting layer, a layered body of a second conductivity type, a constriction layer having a constriction hole, and a first electrode having a lighting hole, wherein an area of said constriction hole is larger than an area of said lighting hole, and the lighting hole and the constriction hole expose a part of said layered body of the second conductivity type, wherein the first electrode and the layered body of the second conductivity type are operatively coupled with one another;
   a second electrode positioned such that charge traveling between the first and second electrodes passes through the light emitting layer; and
   a mirror positioned such that the mirror receives light emitted from the light emitting layer that passes through the layered body of the first conductivity type, and the mirror being constructed and arranged to have a high reflection ratio for light having peak wavelengths between 200 nm to 350 nm.

2. A semiconductor element according to claim 1, wherein said mirror has the reflection ratio such that greater than 60% of light within peak wavelengths between 200 nm to 350 nm received by mirror are reflected.

3. A semiconductor element according to claim 2, wherein said mirror is constructed from Si.

4. A semiconductor element according to claim 2, wherein said mirror comprises a Si substrate having a surface that faces toward the layered body of the first conductivity type.

5. A semiconductor element according to claim 1, wherein said lighting hole and said constriction hole have approximately the same center.

6. A semiconductor element according to claim 1, wherein said second electrode is positioned on side of said light emitting layer opposite from said layered body of the second conductivity type.

7. A semiconductor element according to claim 1, wherein said layered body of the first conductivity type is a p-type or n-type layered body with a material selected from the group consisting of GaN, AlGaN, InGaN, and AlInGaN.

8. A semiconductor element according to claim 7, wherein said layered body of the second conductivity type is opposite to the conductivity type of the first conductivity type and is formed from a material selected from the group consisting of GaN, AlGaN, InGaN, and AlInGaN.

9. A semiconductor element according to claim 8, wherein said constriction layer comprises a material selected from the group consisting of i-type or n-type GaN, AlGaN, InGaN, AlInGaN, and insulating AlN, $SiO_2$, insulated or doped with the opposite conductivity type from the second conductivity type.

10. A semiconductor element according to claim 8, wherein said n-type layered body comprises an n-type contact layer and an n-type cladding layer.

11. A semiconductor element according to claim 8, wherein said p-type layered body comprises a p-type electronic blocking layer, a p-type cladding layer, and a p-type contact layer.

12. A semiconductor element according to claim 1, wherein said light emitting layer comprises a material selected from the group consisting of GaN, AlGaN, InGaN, and AlInGaN.

13. A semiconductor element according to claim 1, wherein said light emitting layer comprises a multiple quantum well structure.

14. A semiconductor element according to claim 1, wherein the first electrode is entirely covered on the constriction layer.

15. A semiconductor element according to claim 1, wherein the first electrode is partially covered on the constriction layer.

16. A semiconductor element according to claim 1, wherein said layered body of the first conductivity type, said light emitting layer, said layered body of the second conductivity type, and the constriction layer are layered in order.

17. A semiconductor element according to claim 1, wherein said constriction layer, said layered body of the second conductivity type, said light emitting layer, said layered body of the first conductivity type are layered in order.

18. A semiconductor element according to claim 1, wherein said mirror has the reflection ratio such that greater than 60% of light within peak wavelengths between 200 nm to 265 nm received by mirror are reflected.

19. A semiconductor element according to claim 18, wherein said mirror is constructed from GaAs.

* * * * *